United States Patent [19]

Deneuville

[11] 4,127,861
[45] Nov. 28, 1978

[54] METAL BASE TRANSISTOR WITH THIN FILM AMORPHOUS SEMICONDUCTORS

[75] Inventor: Alain F. G. Deneuville, Vif - La Rivoire, Isere, France

[73] Assignee: International Business Machines Corporation, Armonk, N.Y.

[21] Appl. No.: 836,874

[22] Filed: Sep. 26, 1977

[51] Int. Cl.$^2$ ........................................... H01L 29/48
[52] U.S. Cl. ..................................... 357/15; 357/4; 357/33; 357/59
[58] Field of Search ..................... 357/4, 15, 33, 59

[56] References Cited

U.S. PATENT DOCUMENTS 4,064,521  12/1977  Carlson ................................ 357/15

Primary Examiner—Edward J. Wojciechowicz
Attorney, Agent, or Firm—Graham S. Jones, II

[57] ABSTRACT

A transistor having a continuously variable modulation characteristic is provided by a structure of two semiconductive films with at least one of them composed of amorphous material sandwiching a thin metallic film base. The transfer characteristics of the device are continuous rather than bistable. When both semiconductive films are amorphous, the transistor can be deposited upon inexpensive crystalline or noncrystalline substrates.

15 Claims, 4 Drawing Figures

METAL BASE TRANSISTOR WITH THIN FILM AMORPHOUS SEMICONDUCTORS

BACKGROUND OF THE INVENTION

1. Field of the Invention

This invention relates to transistors and, more particularly, to amorphous thin film transistors.

2. Description of the Prior Art

An article by A. B. Fowler entitled "Thin Film Technology Part III -Active Thin Film Devices," IEEE Spectrum, June 1964, pp. 102–106, 111 describes thin film transistors (TFT) composed of polycrystalline CdS, CdSe, GeS and PbS, and the hypothetical crystalline semiconductor, metal base transistor is discussed.

U.S. Pat. No. 3,748,501 of Fritzsche et al entitled "Multi-Terminal Amorphous Electronic Control Device," describes a three-terminal threshold (transistor-like) control device which involves the variation of bulk operation of a bistable threshold device. It makes no suggestion of a continuously variable transistor of the N-P-N type, but relies upon hot electrons modulating the bulk conductance of certain other types of amorphous material. An emitter layer 24 of sputtered aluminum metal is deposited upon an insulating substrate. Then there is a layer of sputtered thin film material 28 composed of an insulating material such as $Al_2O_3$, about 75–200Å thick, transparent to electrons. A thin film sputtered metallic base electrode 16 is about 75–200Å thick and composed of Al or Mo. A sputtered amorphous insulative film 12 about 7500–20,000Å thick, has a conductivity threshold characteristic. The materials could be (atomic) As (Te:Ge) (75:(90:10)), TeAsSiGe (40:35:18:6.75) with traces of In 0.25; TeAsGeS (28:34.5:15.5:22); among others. See Col. 2 of the patent. An ohmic contact of a metal such as Al or Mo is deposited upon the amorphous film. While a thin film metal base three-terminal threshold transistor-like switching control device with the variation in the bulk state operation of a bistable threshold device of U.S. Pat. No. 3,748,501, variable state, two-barrier type has been described, amorphous semiconductive film transistors have not been anticipated. Neither has the combination of reversed back-to-back Schottky devices provided here. The Fritzsche et al patent is directed to bistable amorphous devices which do not provide the "infinite" range of outputs as a function of base-electrode potential which can be achieved by such a barrier device as is described here.

Sze et al, "Hot-Electron Transport in Semiconductor-Metal Semiconductor Structures," Journal of Applied Physics, Vol. 37, No. 7, June 1966, p. 2690 teaches a monocrystalline structure with a thin film metallic base deposited upon a monocrystalline substrate of Si in mechanical contact with a crystalline silicon rod emitter. Such crystalline structures are not adapted for application because of the relatively enormous size of the silicon rod and the difficulty of achieving contact without destroying the thin metal film.

U.S. Pat. No. 3,872,492 of Robbins for a "Radiation Hardened Field Effect Transistor" describes use of amorphous silicon as a dielectric material but is not used as an active semiconductive material as in the present invention.

U.S. Pat. No. 4,015,282 of Shaw entitled "Solid State Amplifier Device and Circuit Therefor" describes a semiconductor sandwich with an amorphous layer 6 in the center. Shaw's device is based upon the bistable operation of an amorphous semiconductor and does not provide a continuously variable device as taught here.

Other U.S. Pats. found were Nos. 3,470,426; 3,877,049; 3,886,577; 3,886,578 (thin film deposition of a device) and 3,987,311 (amorphous semiconductors in thin film logic).

Wronski et al in "Schottky-barrier Characteristics of Metal-Amorphous Silicon Diodes," Applied Physics Letters, Vol. 29, No. 9, 1 Nov. 1976, pp. 602–605 describes how an amorphous silicon Schottky diode operates. This reference uses glow discharge deposited amorphous silicon and a Schottky barrier with Pd or Pt metal. No suggestion is made that the Wronski et al teachings can be applied to three-terminal devices.

The Sze et al article does not suggest that a collector (or an emitter) could be vacuum deposited upon the metallic base since it would seem that epitaxial deposition of a monocrystalline silicon film would not be possible upon a metallic base in view of the prior art (Lindmayer, "The Metal-Gate Transistor, " Proceedings IEEE, Vol. 52, 1964, p. 1751). Nothing in the prior art suggests the advantage of substituting amorphous silicon for the monocrystalline silicon or that it would produce a workable device.

Use of more than one layer of an amorphous semiconductor such as hydrogenated amorphous silicon in a thin film transistor is novel. A field effect transistor using only a single layer of amorphous silicon is described in Neudeck et al, Solid State Electronics, Vol. 19, Aug. 1976, pp. 721–729. Use of a thin film semiconductor in a metal base transistor is also novel. No prior art cited teaches use of two layers of amorphous silicon. No combination of two references suggests the device of this invention.

DEFINITION

The semiconductor materials employed in these devices are referred to as having "monostable conductance characteristics" as distinguished from materials with "bistable conductance characteristics" which exhibit alternating insulating and conducting states of operation. The monostable materials are semiconducting with electrical activation energies typically in the range from 0.2 to 0.8 volts.

SUMMARY OF THE INVENTION

In accordance with this invention, a thin film transistor includes a first semiconductor member having a monostable conductance characteristic and a first electrode electrically connected thereto by an ohmic contact material. A transistor base comprises a thin film of a metal bonded to the first semiconductor member and connected to a second electrode. An amorphous thin film layer composed of an amorphous semiconductor material having a monostable conductance characteristic is bonded to the base. A second ohmic contact material is secured to the amorphous thin film layer. An electrode is connected to the amorphous thin film layer by means of the second ohmic contact material. The first member, the base and the amorphous layer form a sandwich.

Preferably, the first semiconductor member is a crystalline semiconductor body.

Alternatively, the first semiconductor body is a thin amorphous film deposited upon a substrate.

Also, in accordance with this invention, a thin film transistor is provided including a first amorphous or crystalline semiconductor member having a monostable conductance characteristic (collector or emitter) and a first electrode which is electrically connected to the first member by means of an ohmic contact material. The base of the transistor is a metal film bonded (as by means of deposition by evaporation or the like) to the first semiconductor member. The base is connected to a second electrode. An amorphous thin film layer of an amorphous semiconductor material having a monostable conductance characteristic (emitter or collector) is bonded to the base (by deposition or the like). An electrode is connected to the amorphous thin film layer by means of ohmic material. If the first member is amorphous, a thin film of amorphous material may be deposited upon a substrate.

Further, in accordance with this invention a thin film transistor is provided including: a first electrode and a layer of an ohmic material electrically connected together, a first thin film layer of an amorphous material having a monostable conductance characteristic, a thin film of metal connected to a second electrode comprising a base, a second thin film layer of an amorphous material having a monostable conductance characteristic, a second layer of ohmic material connected to a third electrode wherein the collector, base, emitter combination has a continuously variable state and a continuously variable response characteristic as a function of input signals applied to the base and another one of the collector and emitter electrodes. Preferably, the transistor is a barrier device, and the amorphous material comprises amorphous hydrogenated-silicon (a-Si:H).

An object of this invention is to provide a thin film, low cost, continuously variable, amorphous transistor.

Another object of this invention is to provide an amorphous thin film transistor structure adapted for low lost manufacture with thin film techniques (such as additive processes including glow discharge deposits, evaporation and sputtering, and/or using subtractive processes and techniques such as sputter etching, reactive ion etching, or chemical etching, plus use of resists, and plating and the like) wherein the cost is maintained low since crystalline structures and epitaxial deposition are not required to manufacture satisfactory amorphous films.

A further object of this invention is to manufacture a thin film transistor at a relatively low temperature in order to prevent high temperature exposure of the substrate which may be covered with thermally sensitive material which could be damaged by a higher temperature.

Still another object of this invention is to provide a thin film transistor which can be used on the same substrate in conjunction with magnetic bubble devices or thin film displays such as an electrochromic, fluorescent, electroluminescent displays, etc. Such devices are often on substrates other than crystalline Si. It is desirable to have transistor structures which can be grown on such noncrystalline substrates.

DESCRIPTION OF THE PREFERRED EMBODIMENT

Figure 1:
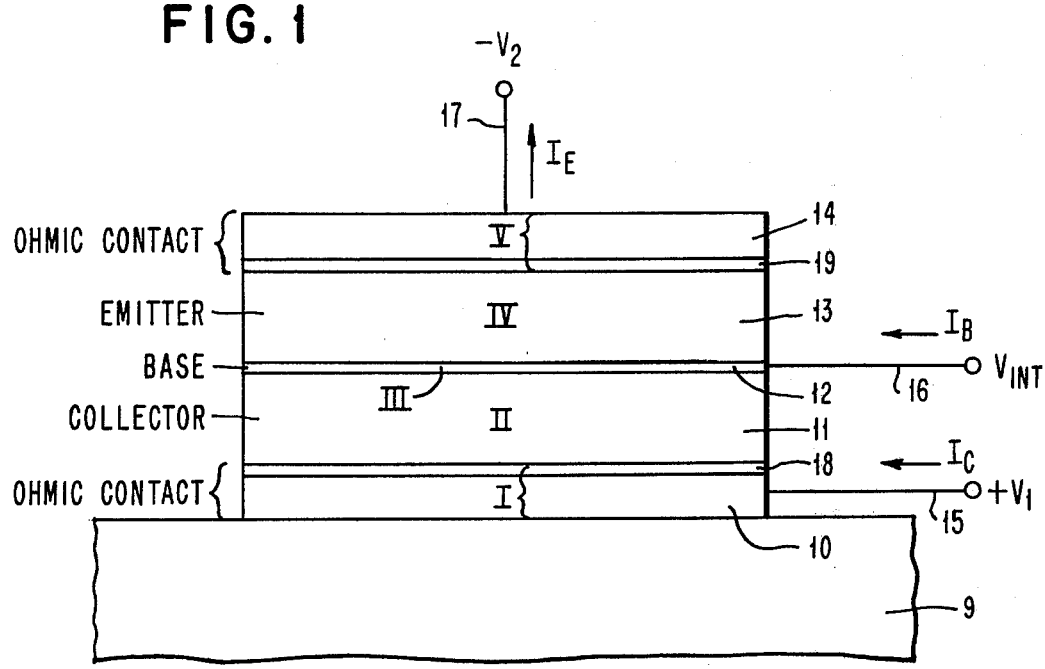
FIG. 1 shows a thin film transistor structure made in accordance with thin invention.

FIG. 1 shows a thin film structure in accordance with this invention. A thin film ohmic contact 10 is deposited upon a substrate 9 composed of one or more layers. Contact 10 is preferably composed of a material such as molybdenum which is coated with degenerately doped $N^+$ hydrogenated amorphous silicon (a-Si:H) layer 18. The substrate 9 is composed of a material such as glass, plastic, silicon, fused quartz, crystalline silicon or other electrical insulators. Contact 10 may have a thickness on the order of 0.1 micrometers.

The next layer 11 is the collector of the transistor composed of a thin film semiconductor preferably comprising an amorphous material having a monostable conductance characteristic such as hydrogenated amorphous silicon (a-Si:H) which can be vacuum deposited as follows:

(a) Decompose silane ($SiH_4$) in a glow discharge onto a substrate at about 250° C. which gives the minimum number of localized electronic states in the semiconductor band gap (W. E. Spear et al, "Investigation of the Localised State Distribution in Amorphous Si Films, Journal of Non-Crystalline Solids 8-10 (1972) 727–738, North Holland Publishing Co.) or (b) R.F. sputter silicon from a silicon target in a reactive atmosphere containing hydrogen onto a substrate at a temperature of about 200° C. (Connell et al, "Use of Hydrogenation in Structural and Electronic Studies of Gap States in Amorphous Germanium," Physical Review B, Vol. 13, No. 2, 15 Jan. 1976 787–804).

For either (a) or (b), N-type and/or P-type doping can also be used to tailor the barrier height. For (a) doping can be done as taught by Spear and LeComber, "Substitutional Doping of Amorphous Silicon," Solid State Communications, Vol. 17, pp. 1192–1196 (1975). For process (b) the doping can be done as taught by Paul et al, "Doping Schottky Barrier and p-n Junction Formation in Amorphous Germanium and Silicon by rf Sputtering," Solid State Communications, Vol. 20, pp. 969–972.

The base layer 12 is deposited upon the collector 11 in the form of a very thin metallic film composed of a metal such as platinum, palladium, etc. which have sufficiently long mean-free paths for hot electrons (on the order of 100Å or more), Sze et al, "Hot-Electron Transport in Semiconductor-Metal-Semiconductor Structures," supra by means of vacuum deposition by a technique such as evaporation of the metal to a thickness of about 100Å or less or a minimum metal thickness which nevertheless assures there will be no pinholes in the metal layer 12. As an example, a platinum layer of 90Å thickness has proved satisfactory between two layers of glow discharge deposited hydrogenated amorphous silicon (a-Si:H). Base 12 is connected to electrode 16 by means of conventional fabrication techniques well known to those skilled in transistor manufacture including stepping back the boundaries of layers.

The emitter layer 13 is a thin amorphous semiconductor film having a monostable conductance characteristic, as is layer 11. Preferably the emitter 13 is composed of another vacuum deposited layer of an amorphous film such as a-Si:H made in the same way as the collector layer 11.

A thin film ohmic, metallic film, contact 14 is preferably analogous to layer 10 with the N+ (a-Si:H) layer 19 deposited on layer 13 before the metallic film 14 composed, for example, of aluminum.

OPERATION OF DEVICE (FIG. 1)

The device can operate as a crystalline-silicon (C-Si)/metal/C-Si transistor operates. For example, one can apply a voltage $-V_2$ to emitter 13 (IV), $V_{Int}$ to base 12 (III), $+V$ to collector 11 (II). Electrons are emitted by the emitter 13 (IV) over the potential barrier 13-12 (IV-III). Some of these electrons will be thermalized in the metal 12 giving a DC base current $I_B$. A low base current is desirable. Thus, the metal layer 12 should have a large mean-free path for hot electrons. It can be optimized by using a suitable metal with the longest possible mean-free path for hot electrons. The layer should be of the minimum thickness achievable without pinholes. The junction III-II is polarized in the reverse bias direction and collects the. hot electrons remaining after passing through the base 12 giving an extra current which adds to the reverse current of the collector-base Schottky barrier. The collector current is $I_C = I_E - I_B$. AC amplification is obtained as in a usual transistor by applying AC voltage (or current) across the base electrode 16 and emitter electrode 17 and collecting the resulting AC current at the collector electrode 15.

Figure 3:
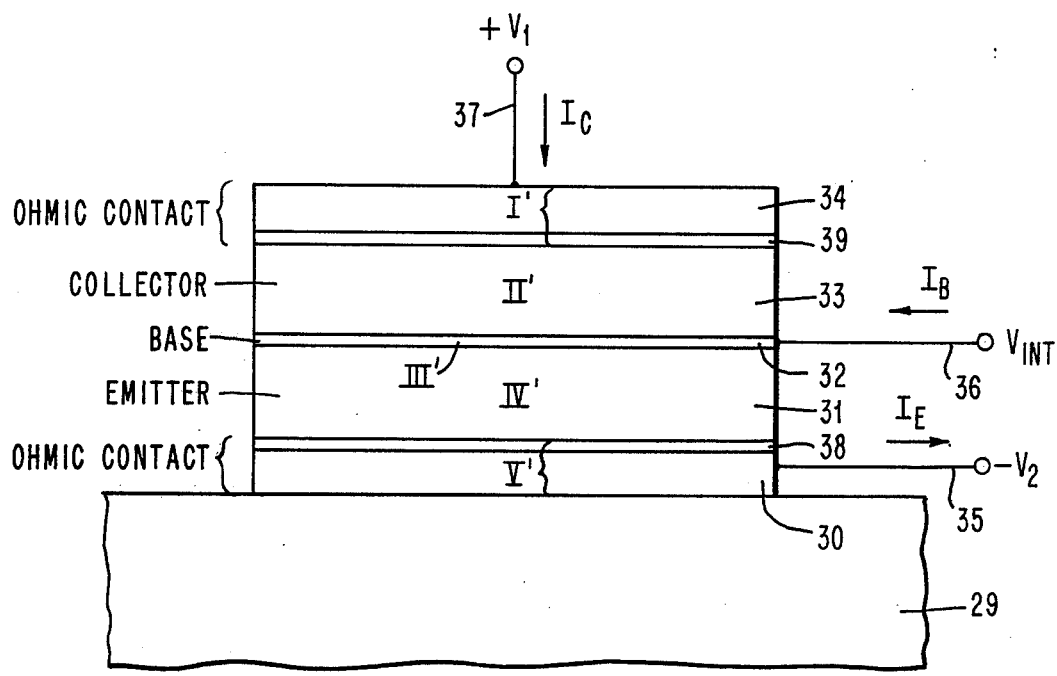
FIG. 3 shows another thin film transistor structure similar to that shown in FIG. 1 with the positions of the collector and emitter reversed.

FIG. 3 shows an alternative embodiment of this invention to the embodiment of FIG. 1 with the collector and emitter reversed in position. A thin film ohmic contact 30 is deposited upon a substrate 29 composed of one or more layers. Contact 30 is preferably composed of a material such as molybdenum which is coated with degenerately doped N+ hydrogenated amorphous silicon (a-Si:H) layer 38. The substrate 29 is composed of a material such as glass, plastic, silicon, fused quartz or other electrical insulators. Contact 30 may have a thickness on the order of 0.1 micrometers.

The next layer 31 is the emitter of the transistor composed of a thin film semiconductor preferably comprising an amorphous material such as hydrogenated amorphous silicon (a-Si:H) having a monostable conductance characteristic which can be vacuum deposited as was collector 11 in FIG. 1.

The base layer 32 is deposited upon the emitter 31 in the form of a very thin metallic film composed of a metal such as platinum or palladium, as was layer 12 in FIG. 1. An electrode 36 connects base layer 32 to bias source $V_{INT}$. Basically, the statements above concerning layer 12 apply.

The collector layer 33 is a thin semiconductor film, as is like layer 31. Preferably, the collector 33 is composed of another vacuum deposited layer of an amorphous film such as a-Si:H having a monostable conductance characteristic made in the same way as the emitter layer 31.

A thin film ohmic, metallic film, contact 34 is preferably analogous to layer 10 with the N+ (a-Si:H) layer 39 deposited on layer 33 before the metallic film 34 composed, for example, of aluminum.

OPERATION OF DEVICE (FIG. 3)

The device can operate as a C-Si/metal/C-Si transistor operates. For example, one can apply a voltage $-V_2$ to emitter 31 (IV'), $V_{INT}$ to base 32 (III'), $+V_1$ to collector 33 (II'). Electrons are emitted by the emitter 31 (IV') over the potential barrier (31-32) (IV'-III'). Some of those electrons will be thermalized in the metal 32 giving a DC base current $I_B$. A lower base current is desirable. Thus, the metal layer 32 should have a larger mean-free path for hot electrons, which can be optimized with the minimum thickness of layer achievable without pinholes. The junction III'-II' is polarized in the reverse bias direction and collects the hot electrons remaining after passing through the base 32 giving the collector current $I_C = I_E - I_B$. AC amplification is obtained as in a usual transistor by applying AC voltage (or current) across the base electrode 36 and emitter electrode 35 and collecting the resulting AC current at the collector electrode 37.

An important feature of this invention is the use of several thin film layers to create back-to-back diodes separated by a thin metal film across which electrons can travel ballistically. The corresponding electron energy as a function of distance diagram is shown schematically on FIG. 2. The different regions are not shown to scale. Electrons injected from the forward-biased emitter are collected by the reverse-biased collector under the control of the contact to the metal base. The different regions I-V of the energy diagram in FIG. 2 correspond to the layers with the same number in FIGS. 1 and 3.

Figure 2:
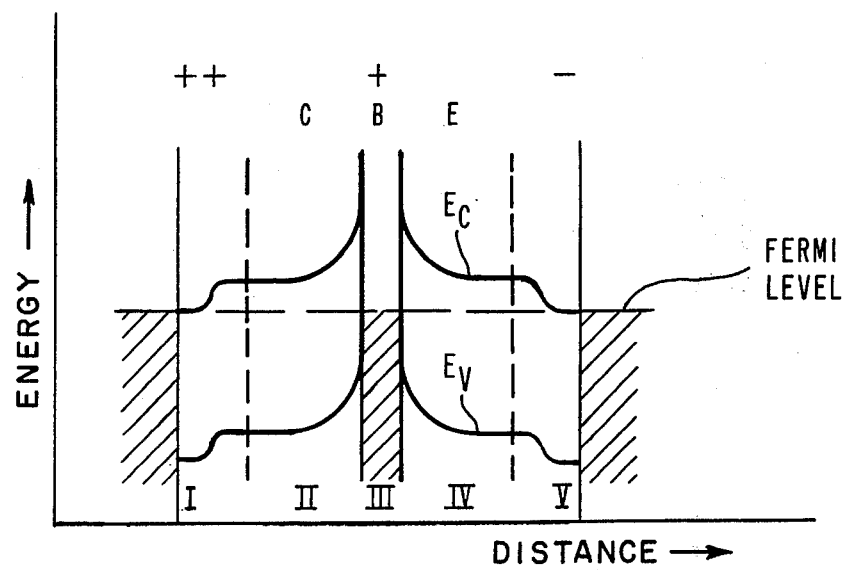
FIG. 2 is a diagram of electrical potential of electrons in the device of FIG. 1 as a function of distance perpendicular to the layers of the thin film transistor shown in FIG. 1.

FIG. 2 is a schematic representation, known as an energy-band diagram, of electron energy versus distance across the device. The energy diagram in FIG. 2 is drawn in the manner customary in the art of semiconductor surface studies; for example, refer to S. M. Sze, Physics of Semiconductor Devices, J. Wiley & Sons, Inc., N.Y., 1969, Ch. 8 and explained in Ch. 3, pages 17-24. Regions I and V are the metal to heavily doped semiconductor contact layers which together form the ohmic contacts. Regions II and IV are the lightly doped or undoped semiconductor layers with the space charge zones and barriers created by their contact with the metal base region III. In operation, a positive bias to the base with respect to the emitter will cause injection of electrons from the emitter region IV into the base region III. Some of these injected electrons will arrive at the collector-base interface with high enough energy to cross the barrier and be swept into the collector under the influence of the electric field near the collector-base interface. The control of the amount of electron current in the collector is provided by the base-emitter bias and/or the base-collector bias. The upper curve $E_C$ represents the lower limit of conduction band energy as a function of distance. The lower curve $E_V$ represents the upper limit of the valence band as a function of distance. Between those limits is the forbidden band. (See C. Kittel, Introduction to Solid State Physics, John Wiley & Sons, Inc., N.Y.,1956, p. b 347-401.) The lower limit of the conductor band $E_C$ at its highest point in the emitter indicates the energy level an electron must have attained to cross the emitter-base junction. Crossing from the base to the emitter does not require extra energy.

Figure 4:
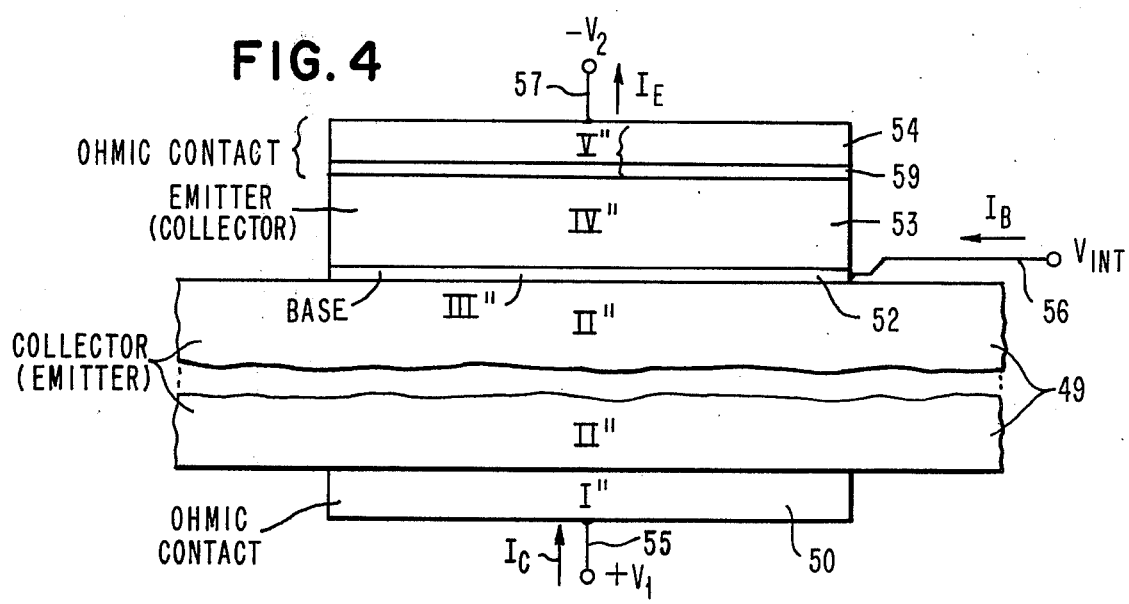
FIG. 4 shows a hybrid crystalline-amorphous metal base transistor in accordance with this invention.

FIG. 4 shows an alternative hybrid form of amorphous semiconductor, thin film metal base transistor, wherein either, but not both, of the emitter or collector portion of the transistor is composed of a crystalline semiconductor material having a monostable conductance characteristic. A fragment of an element 49 of a wafer of crystalline semiconductor material, preferably silicon or GaAs or Ge, etc. is shown having an ohmic contact layer 50 on the back side with an electrode 55 connected thereto which is shown with a potential $+V_1(-V_2)$ suitable for use of element 49 as a collector (emitter) of a transistor. (Element 49 is similarly adapted to being used as an emitter upon reversal of bias polarity to $-V_2$ as illustrated by FIGS. 1 and 3.) Contact 50 can be an ordinary variety of contact employed in the semiconductor art as is well known to those skilled in the art.

The first layer deposited upon the element 49 is a thin film metallic base layer 52 in the form of a thin metallic film composed of a metal which such as chromium has a sufficiently long mean-free path. The metallic base layer 52 can be deposited upon the element 49 by a technique such as evaporation of metal to a thickness on the order of 100A or less as in the case of base 12 in FIG. 1. Base 52 is connected by electrode 56 to voltage source $V_{INT}$.

An emitter (collector) layer 53 is a thin amorphous semiconductor film having a monostable conductance characteristic is bonded to base layer 52. Preferably, the emitter (collector) layer 53 is composed of a vacuum deposited layer of an amorphous film such as a-Si:H made in the same way as collector 11 in FIG. 1.

A thin film ohmic, metallic film, contact 54 is preferably analogous to layer 10 in FIG. 1 with an N+ (a-Si:H) layer 59 deposited upon layer 53 before the metallic film 54 composed, for example, of aluminum. It is connected by electrode 57 to voltage $-V_2$ $(+V_1)$. Operation of the device is directly analogous to operation of the device of FIG. 1 (FIG. 3), as described above.

The three terminal devices of FIGS. 1, 3 and 4 can be used in the same manner as classical crystalline transistors in electronic circuitry either in DC applications or in AC amplification or impedance adaptation. (See S. M. Sze, Physics of Semiconductor Devices, John Wiley & Sons, Inc., N.Y., 1964, p. 262.) For example, the three usual arrangements, common base with DC bias applied between emitter and base (V and III (prime and double prime) on FIGS. 1, 3 and 4)) and base and collector (III and I on FIGS. 1, 3 and 4), common emitter with DC bias applied between emitter and base (V and III on FIGS. 1, 3 and 4) and emitter and collector (V and I on FIGS. 1, 3 and 4).

The semiconductive materials of this invention have a "monostable conductance characteristic" as contrasted with materials referred to herein as having a "bistable conductance characteristic" such as chalcogenide glasses including alloys of As, Te, and Ge which have bistable conductance states.

Table I shows data secured for a device built in accordance with FIG. 1. The device was deposited upon a crystalline substrate of silicon. A thin ohmic contact of about 1500Å of molybdenum was deposited by evaporation upon the silicon substrate. Then an N+ doped hydrogenated amorphous silicon layer was deposited upon the layer of molybdenum from a glow discharge of a mixture of silane and phosphine. Next a collector layer of about 6000Å thick of intrinsic amorphous hydrogenated silicon was deposited upon the N+ doped layer from a glow discharge of pure silane. In the next step, a base of about 90Å thick thin film of platinum was deposited by evaporation upon the collector layer. Then an emitter layer of about 6000Å thick amorphous hydrogenated silicon was deposited upon the base layer as above. Next, a 200Å thick N+ amorphous hydrogenated film was applied as above, followed by an about 2000Å thick aluminum contact evaporated layer.

The thicknesses of the contact layers must be great enough to carry the current through the device as is well known by those skilled in the art.

Table I

| (Top) Emitter | | (Bottom) Collector | | Injection Parameters | |
|---|---|---|---|---|---|
| $V_{BE}$ (volts) $=V_{INT}-(-V_2)$ | $I_E$ (H) | $V_{BC}$ (volts) $V_1-V_{INT}$ | $I_C$ (H) | $\Delta I_C$ (H) | $\Delta I_C/I_E$ |
| 0 | 0 | 0 | 0 | 0 | |
| 0.2 | $1.2\times10^{-9}$ | 0 | 0 | $6\times10^{-12}$ | $5\times10^{-3}$ |
| 0.5 | $1.2\times10^{-8}$ | 0 | 0 | $1.4\times10^{-11}$ | $1.16\times10^{-3}$ |
| 0.5 | $1.2\times10^{-8}$ | 1.0 | $1.7\times10^{-10}$ | $3\times10^{-11}$ | $2.5\times10^{-3}$ |
| 0.5 | $1.2\times10^{-8}$ | 2.5 | $7.5\times10^{-9}$ | $1\times10^{-9}$ | $8\times10^{-2}$ |
| Forward Biased | | Reverse Biased | | | |

What is claimed is:

1. A thin film transistor including
   a first semiconductor member having a monostable conductance characteristic and a first electrode electrically connected thereto by an ohmic contact material,
   a transistor base comprising a thin film of a metal bonded to said first semiconductor member and connected to a second electrode,
   an amorphous thin film layer composed of an amorphous semiconductor material having a monostable conductance characteristic and bonded to said base,
   a second ohmic contact material secured to said amorphous thin film layer,
   an electrode connected to said amorphous thin film layer by means of said second ohmic contact material, and
   said first member, said base and said amorphous layer forming a sandwich.

2. A transistor in accordance with claim 1 wherein said first semiconductor member is a crystalline semiconductor body.

3. A transistor in accordance with claim 1 wherein said first semiconductor body is a thin amorphous film deposited upon a substrate.

4. A thin film transistor including
   an insulating substrate having secured by deposition thereon, in stacked relationship,
   a first layer of an ohmic material deposited upon said substrate,
   a first electrode,
   said first electrode and said first layer of ohmic material being electrically connected together,
   a first amorphous thin film layer composed of an amorphous material having a monostable conductance characteristic bonded to said first layer,
   a thin film of metal bonded to said first amorphous thin film layer connected to a second electrode,
   a second amorphous thin film layer composed of an amorphous material having a monostable conductance characteristic bonded to said thin film of metal,
   a second layer of ohmic material bonded to said second amorphous thin film layer and connected to a third electrode, whereby said transistor is adapted to have a continuously variable state and a continuously variable response characteristic as a function of input signals applied to the base and another one of the collector and emitter electrodes when connected in an electronic circuit.

5. A transistor in accordance with claim 4 wherein said transistor is a barrier device.

6. A transistor in accordance with claim 4 wherein said amorphous material comprises amorphous hydrogenated-silicon (a-Si:H).

7. A thin film transistor including
an insulating substrate, an emitter, a base, a collector and first and second layers of ohmic material and three electrodes including a first electrode, a second electrode and a third electrode,
said first electrode and said first layer of ohmic material being deposited upon said substrate and said first layer of ohmic material and said first electrode being electrically connected together,
said collector comprising a first amorphous thin film layer composed of an amorphous material having a monostable conductance characteristic deposited upon said first layer of ohmic material,
said base comprising a thin film of metal deposited upon said collector, said base being electrically connected to said electrode,
said emitter comprising a second amorphous thin film layer composed of an amorphous material having a monostable conductance characteristic deposited upon said base,
said second layer of ohmic material being deposited upon said emitter connected to a third electrode,
whereby said collector, base, emitter combination is adapted to have a continuously variable state and a continuously variable response characteristic as a function of input signals applied to the base and another one of the collector and emitter electrodes.

8. A transistor in accordance with claim 7 wherein said transistor is a barrier device.

9. A transistor in accordance with claim 7 wherein said amorphous material comprises amorphous hydrogenated-silicon (a-Si:H).

10. A thin film transistor including
an insulating substrate, with remaining elements of said transistor deposited upon said substrate, said transistor including an emitter, a base layer, a collector layer and first and second layers of ohmic material and three electrodes including a first electrode, a second electrode, and a third electrode.
said first layer of ohmic material being deposited upon said substrate,
said first electrode and said first layer of ohmic material being electrically connected together,
an emitter comprising a first amorphous thin film layer composed of an amorphous material having a monostable conductance characteristic deposited upon said first layer,
a base comprising a thin film of metal deposited upon said emitter, said base being connected to said second electrode,
a collector comprising a second amorphous thin film layer composed of an amorphous material having a monostable conductance characteristic deposited upon said base,
a second layer of ohmic material being deposited upon said collector connected to a third electrode,
whereby said collector, base, emitter combination has a continuously variable state and a continuously variable response characteristic as a function of input signals applied to the base and another one of the collector and emitter electrodes.

11. A transistor in accordance with claim 10 wherein said transistor is a barrier device.

12. A transistor in accordance with claim 10 wherein said amorphous material comprises amorphous hydrogenated-silicon (a-Si:H).

13. A thin film transistor including
an insulating substrate having secured by deposition thereon, in stacked relationship an emitter layer, a base layer, a collector layer and first and second layers of ohmic material and three electrodes including a first electrode, a second electrode, and a third electrode,
said first electrode and said first layer of an ohmic material being electrically connected together,
said collector comprising a first amorphous thin film layer composed of an amorphous material having a monostable conductance characteristic bonded to said first layer,
said base comprising a thin metallic film bonded to said collector, said thin metallic film being connected to said second electrode,
said emitter comprising a second amorphous thin film layer composed of an amorphous material having a monostable conductance characteristic bonded to said base,
a second layer of ohmic material bonded to said emitter connected to a third electrode,
whereby said collector, base, emitter combination has a continuously variable state and a continuously variable response characteristic as a function of input signals applied to the base and another one of the collector and emitter electrodes.

14. A transistor in accordance with claim 13 wherein said transistor is a barrier device.

15. A transistor in accordance with claim 13 wherein said amorphous material comprises amorphous hydrogenated-silicon (a-Si:H).

* * * * *